United States Patent [19]

Tomasi

[11] Patent Number: 4,642,608
[45] Date of Patent: Feb. 10, 1987

[54] DIGITAL-TO-ANALOGUE CONVERTER ARRANGEMENT

[75] Inventor: Jean-Pierre Tomasi, Les Molieres, France

[73] Assignee: U.S. Philips Corporation, New York, N.Y.

[21] Appl. No.: 705,938

[22] Filed: Feb. 26, 1985

[30] Foreign Application Priority Data

Mar. 2, 1984 [FR] France ................................ 84 03280

[51] Int. Cl.$^4$ ............................................. H03K 13/00
[52] U.S. Cl. ....................... 340/347 DA; 340/347 CC
[58] Field of Search ................... 340/347 DA, 347 CC

[56] References Cited

FOREIGN PATENT DOCUMENTS 822208  6/1979  U.S.S.R. ...................... 340/347 DA

Primary Examiner—William M. Shoop, Jr.
Assistant Examiner—Sharon D. Logan
Attorney, Agent, or Firm—Robert T. Mayer; Bernard Franzblau

[57] ABSTRACT

A digital-to-analogue converter arrangement employs a digital-to-analog converter circuit (10) of a type producing an output voltage V(n') such that:

$$V(n') = k \cdot E \cdot \frac{n'}{M'}$$

where k is a constant, E is a voltage applied to a reference voltage input, n' is a binary number applied to a binary signal input and M' is the maximum value n' can attain. The converter arrangement includes a negative feedback network (20) coupled between the output (13) of the digital-to-analogue converter circuit and the reference voltage input (14).

7 Claims, 2 Drawing Figures

DIGITAL-TO-ANALOGUE CONVERTER ARRANGEMENT

The present invention relates to a digital-to-analogue converter arrangement formed on the basis of a digital-to-analogue converter of a type producing at its output an output voltage V'(N') such that:

$$V'(n') = k \cdot E \cdot \frac{n'}{M'} \quad (1)$$

where k is a constant, E is a voltage applied to a reference voltage input, n' is a binary number applied to an input for binary signals and M' is the maximum value n' can attain.

This type of converter arrangement is very advantageous for signal processing applications.

Because to the linearity of equation (1), the steps by which the voltage V develops result in an imprecision which is relatively greater for small amplitudes of the value V than for the large amplitudes. If a high precision for weak amplitudes is required, a digital-to-analogue converter circuit must be used in which "n'" is formed from many binary elements.

The invention has for an object to provide a digital-to-analogue converter arrangement providing a high precision for a low-amplitude output voltage without utilizing a binary number "n'" formed from many binary elements. To that end, a digital-to-analogue converter arrangement of the above-defined type is characterized in that is comprises a feedback network arranged between the reference voltage output and input.

Such a network may produce non-linearities between the output voltage and the number "n'". These non-linearities are not always desirable. In accordance with an important characteristic of the invention, a digital-to-analogue converter arrangement according to the invention is further characterized in that transcoder means are provided which, starting from a number "n" whose maximum value can reach M, adjust such a number "n'" that a "pseudo-linear" relationship is established between the number "n" and the voltage V':

$$V'(n_p) = K \cdot \frac{n_p}{M} \quad (2)$$

where K is a constant and $n_p$ are specific values of n.

A "pseudo-linear" relationship must be understood to mean a relation which is only linear for certain values $n_p$ of "n". This notion will be explained in greater detail in the sequel of this description.

The following description, which is given by way of non-limiting example, with reference to the accompanying drawings will make it better understood how the invention can be put into effect.

Figure 1:
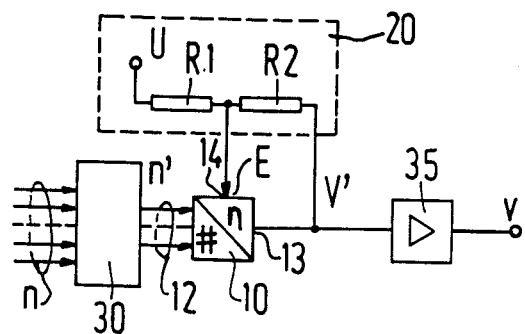
FIG. 1 shows a circuit diagram of a digital-to-analogue converter arrangement according to the invention.

FIG. 1 shows the digital-to-analogue converter arrangement according to the invention. It is formed around a digital-to-analogue converter circuit 10, for example an integrated circuit of the type NE 5020 produced by Signetics Corp. With a voltage V' at output 13, i.e. pin 2(1) of NE 5020 there must correspond a binary number n' applied to input 12 according to:

$$V' = k \cdot E \cdot \frac{n'}{M'}$$

where k is a constant and E is the voltage applied to its reference-signal input 14, i.e. pin (17) of NE 5020, M' is the maximum value the number n' can assume, M' has the form:

$$M' = 2^b - 1$$

where b represents the number of binary elements of the number n'.

By way of example, let it be assumed that such a converter arrangement is used in radio-navigation to apply a control voltage to an altimeter display derived from a digital information processed by a radio altimeter. The object is to supply a voltage between 0 and 25 Volts for altitudes in the range between 0 and 5000 ft and with a resolution better than 0.5 ft near 0, that is to say that at this level the voltage must evolve in steps of 2.5 mV. According to the prior art this requires the use of a 14-element binary converter. The invention makes it possible to produce a voltage which is accurate within 2.5 mV for low values of V using a digital-to-analogue converter circuit processing 10-binary element numbers n' (M'=1023).

Therefore, the digital-to-analogue converter is characterized in that is comprises a feedback network (20) arranged between the output where the voltage V' appears and the reference-signal input. This network (20) is constituted by a series arrangement of two resistors R1 and R2. A voltage U of 10 Volts is applied to the first end of this series arrangement and the output voltage V' is applied to the second end. The junction of these two resistors R1 and R2 is connected to the input 14. The designers have constructed the digital-to-analogue converter circuit in such a manner that at this input 14 the value of the voltage must be limited so that, to obtain the required 25 Volts, a d.c. amplifier 35 having a gain equal to 2.5 is used. The output voltage V of the amplifier 30 is then V=2.5 V'.

The voltage E is then written as:

$$E = U \frac{R2}{R1 + R2} + V' \frac{R1}{R1 + R2} \quad (3)$$

Assuming $$\alpha = \frac{R2}{R1 + R2},$$

then:

$$V' = \frac{\alpha \cdot U \cdot n' \cdot k}{M' - (1 - \alpha) \cdot n' \cdot k} \quad (4)$$

For the sake of simplicity, let it be assumed for the further course of the description that k=1; assuming α=0.1 it will be obvious that V evolves for n'=0, 1, 2 by steps of 2.4 mV. It will be obvious that this precision is only reached for low values of n'; for n'=1020, 1021 the steps become of the order of 290 mV.

Formula (4) demonstrates that the parameter V is not a linear function of the variable n'. In the practical example, calculating the altitude is obviously estimated by means of the number n with the highest possible precision, which provides that the number "n" is defined by 14 binary elements (M=16 383). A transcoding circuit 30 is provided by means of which it is possible to obtain a voltage V which is proportional to the number "n" while having the precision required for low amplitudes. The transcoding circuit may be a read-only memory which causes a code "n'" to correspond to the whole code "n" by means of the formula:

$$n' = \frac{n \cdot M}{M\alpha + (1 - \alpha)n} \quad (5)$$

Figure 2:
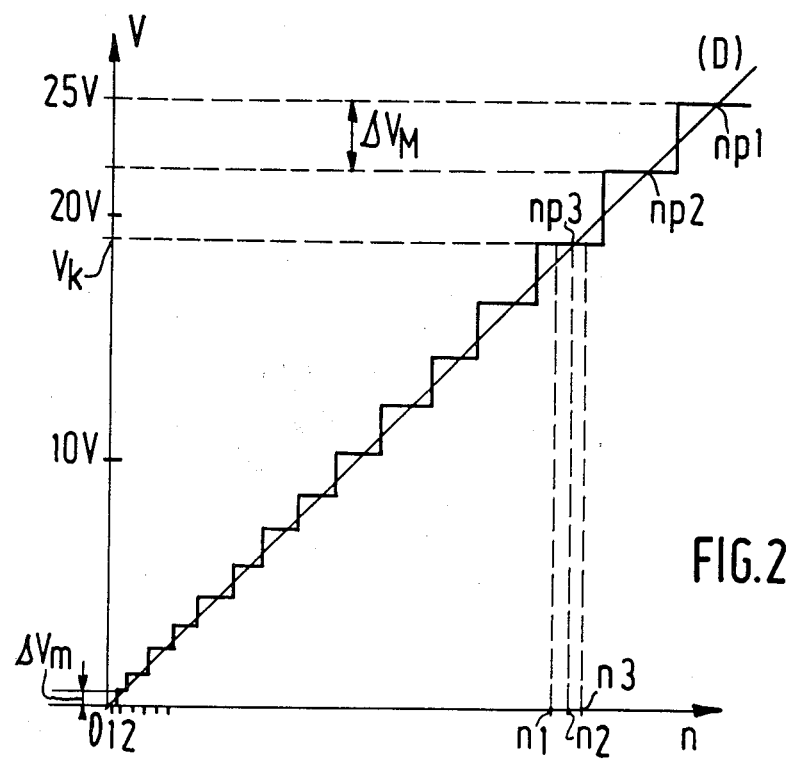
FIG. 2 illustrates the shape of the "staircase" curve which represents the voltage V as a function of the number "n".

The integral value which is nearest to the value given by (5) is taken for "n'". In practice, a value of "n'" will correspond to each n for low values of "n". This will not be the case anymore for high values or for several values of "n" to which a sole value of "n'" corresponds. Thus, it is said that there is a pseudo-linear relationship between V or V' and the value "n". FIG. 2 shows schematically the shape of the staircase curve which causes V to correspond to the value n. It is shown that the absolute errors of the low values of n and V are smaller than the absolute errors of the high values of of V and n for which the steps are larger. The plateaus are wider because of the fact that the transcoding circuit produces the same value (n') for several values of "n". Thus, in FIG. 2, when n=n1, n2, n3 the same voltage value $V_K$ is obtained, while for n=0, 1, 2 there are different values of V. The feedback network 20 causes deviations between the plateaus which vary from $\Delta V_m$ to $\Delta V_M$. The specific values $n_{p1}$, $n_{p2}$ ... of formula (2) are taken approximately in the centre of the plateaus so that a straight line D can be drawn through these points and the point of origin O. This straight line D represents the ideal linear function between "n" and "V".

It should be noted that the use of feedback networks other than those described are of course also within the scope of the invention.

What is claimed is:

1. A digital-to-analogue converter arrangement comprising a digital-to-analogue converter circuit of a type producing at its output an output voltage V'(n') such that:

$$V(n') = k \cdot E \cdot \frac{n'}{M'}$$

where k is a constant, E is a voltage applied to a reference voltage input of the digital-to-analog converter circuit, n' is a binary number applied to a binary signal input of the digital-to-analog converter circuit and M' is the maximum value n' can attain, a negative feedback network coupled between the output of the digital-to-analogue converter circuit and the reference voltage input thereof, and a transcoding means coupled to said binary signal input and which, from a number "n" whose maximum value may reach M, adjust a number "n'" such that there is a "pseudo-linear" relationship between the number "n" and the voltage V':

$$V(n_p) = K \cdot \frac{n_p}{M}$$

where K is a constant and $n_p$ are the specific values of n.

2. A digital-to-analogue converter arrangement as claimed in claim 1, wherein the negative feedback network comprises a series arrangement of two resistors $R_1$ and $R_2$ one end of which receives a fixed voltage U and the other end receives the output voltage V', a junction between said two resistors being connected to the reference voltage input.

3. A digital-to-analogue converter arrangement as claimed in claim 2, characterized in that the transcoding means cause n and n' to be related in accordance with the formula:

$$n' = \frac{n \cdot M'}{M\alpha + (1 - \alpha)n}$$

where $$\alpha = \frac{R2}{R1 + R2}.$$

4. A digital-to-analogue converter arrangement as claimed in claim 3 wherein the transcoding means comprise a read-only memory.

5. A digital-to-analogue converter arrangement as claimed in claim 1 further comprising a d.c. amplifier coupled to the output of the digital-to-analog converter circuit for increasing the output voltage thereof.

6. a digital-to-analog converter arrangement as claimed in claim 1 wherein the negative feedback network comprises a series arrangement of two resistors R1 and R2 coupled between a source of fixed voltage and the output of the digital-to-analog converter circuit and having a junction connected to the reference voltage input, and wherein the transcoding means cause n and n' to satisfy the relationship:

$$n' = \frac{n \cdot M'}{M\alpha + (1 - \alpha)n}$$

where $$\alpha = \frac{R2}{R1 + R2}.$$

7. A digital-to-analog converter arrangement as claimed in claim 1 wherein the transcoding means comprise a read-only memory.

* * * * *